US006603144B2

(12) United States Patent
Tsunai

(10) Patent No.: US 6,603,144 B2
(45) Date of Patent: Aug. 5, 2003

(54) SOLID-STATE IMAGING DEVICE AND METHOD FOR FABRICATING SAME

(75) Inventor: Shiro Tsunai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 196 days.

(21) Appl. No.: 09/732,844

(22) Filed: Dec. 8, 2000

(65) Prior Publication Data
US 2001/0004116 A1 Jun. 21, 2001

(30) Foreign Application Priority Data
Dec. 15, 1999 (JP) .......................... 11-355985

(51) Int. Cl.$^7$ ............................. H01L 29/04
(52) U.S. Cl. ............... 257/72; 257/226; 257/215; 257/221; 257/233
(58) Field of Search .................. 257/72, 226, 233, 257/215, 221

(56) References Cited
U.S. PATENT DOCUMENTS
4,268,845 A * 5/1981 Koike et al.
2001/0004116 A1 * 6/2001 Tsunai

FOREIGN PATENT DOCUMENTS

| JP | 57-15477 | 1/1982 |
| JP | 60-31111 | 7/1985 |
| JP | 5-335546 | 12/1993 |
| JP | 6-89998 | 3/1994 |

* cited by examiner

Primary Examiner—Fetsum Abraham
(74) Attorney, Agent, or Firm—Choate, Hall & Stewart

(57) ABSTRACT

P-type ion implantation is done in N well 15, so as to form a charge drain control layer 17 and form a photodiode N well 16 and OFD drain 5, the result being that, even if there is variation in the potential of the photodiode N well 16 making up the photodiode, because the variation in the potential of the charge drain control layer 17 is in the same direction as the potential of the photodiode N well 16, so that variation does not occur in the maximum amount of electrical charge that can be accumulated, the result being that there is no variation in the signal in the saturation condition.

6 Claims, 12 Drawing Sheets

- BORON ION IMPLANTATION TO FORM THE CHARGE DRAIN CONTROL LAYER 17
  $5.0 \times 10^{12} / cm^2$
- × BORON ION IMPLANTATION TO FORM THE PHOTODIODE CHANNEL STOPPER 6 AND BORON ION IMPLANTATION TO FORM THE CHARGE DRAIN CONTROL LAYER 17
  $5.0 \times 10^{12} / cm^2$ WIDTH IS APPROXIMATELY 1 μm

US 6,603,144 B2

SOLID-STATE IMAGING DEVICE AND METHOD FOR FABRICATING SAME

BACKGROUND OF THE INVENTION

1. Field of the Invention

The present invention relates to a solid-state imaging device and method, and more particularly to a solid-state imaging device having an overflow drain (hereinafter referred to as OFD) structure for draining off an excess electrical charge generated in a photodiode.

2. Related Art

A first example of prior art is the horizontal overflow drain structure shown in FIG. 8 to FIG. 10, of which FIG. 8 is a plan view of the structure, FIG. 9 is a cross-sectional view of the structure along the cutting line Z–Z' of FIG. 8 and the potential distribution in the operating condition, and FIG. 10 is a cross-sectional view along the cutting line U–U' of FIG. 8 and the potential distribution in the operating condition.

In the first prior art example of FIG. 9, the difference with respect to the present invention is the existence of a shutter gate 34 over the gate oxide film 48, the shutter gate 34 is a gate of a surface channel transistor in the P well 42. The other elements of the first layer polysilicon gate 31, the readout gate 33, the P⁺ channel stopper 43, the charge transfer N well 44, and the interlayer insulation film 51, are the same as in the structure of the present invention. Control of OFD operation is done by applying a voltage to the shutter gate 34, so as to drain off electrons 49 in the photodiode 45 through a surface channel.

A second example of prior art is the vertical-type overflow drain structure shown in FIG. 11 to FIG. 13, of which FIG. 11 is a plan view thereof, FIG. 12(a) is a cross-sectional view along the cutting line V–V' in FIG. 11, FIG. 12(b) is a potential distribution diagram in the operating condition, and FIG. 13 is a potential distribution diagram in the operating condition along the cutting line W–W' of FIG. 12, in which the upper line is the potential when electrons 79 are accumulated in the photodiode N well 76, and the lower line is the potential when the electrons 79 accumulated in the photodiode N well 76 are read out to the charge transfer N well 74 by applying a voltage to the readout gate 63 so as to raise the surface potential of the P well 72.

In a vertical-type overflow drain structure, photodiode N well 76 on the opposite side from the charge transfer N well 74 is in contact with the P⁺ channel stopper 73, and the electrons 79 accumulated in the photodiode N well 76 are controlled by the voltage applied to the N-type substrate 71. In this case, in order that electrons from parts other than the photodiode N well 76 are not pulled out to the N-type substrate 71, a second P well 80 is provided. The other elements of a first layer polysilicon gate 61, a readout gate 63, a charge transfer N well 74, and an interlayer insulation film 81, are the same as the structure of the present invention.

In a solid-state imaging device of the prior art as described above, however, there are the following problems.

First, in the first prior art example, in order to increase the red sensitivity of the part made up of the photodiode N well 46 and photodiode cap layer 37 of the photodiode part, it is necessary to form an N-type region as far as a deep position (1 to 2 μm) in the substrate, so that there was a tendency for variations to occur in the potential of the photodiode part (potential B in FIG. 9) during operation. For this reason, by considering the manufacturing margin in the impurity concentration in the photodiode N well 46, it was necessary to make the shutter gate voltage of the OFD part high.

In the second example of prior art, because it is necessary to create a second P well 72 at a deep position (3 to 4 μm) within the substrate, there was a tendency for variations to occur in that position. For this reason, there was a tendency for variations to occur in the substrate applied potential for pulling electrons 79 away from the photodiode N well 76. Additionally, it was necessary to apply a high voltage (15 V or higher) to the substrate.

Accordingly, it is an object of the present invention to provide a solid-state imaging device with a vertical-type overflow drain structure, which reduces the variations in the amount of accumulated charge in the photodiode part, and that enables the drain off of electrons accumulated in the photodiode with a low control voltage and having good repeatability.

SUMMARY OF THE INVENTION

To achieve the above-noted object, the present invention has the following basic technical constitution.

Specifically, a first aspect of the present invention is a solid-state imaging device comprising; an opto-electrical conversion well of a first conductivity type formed on a substrate, a separation layer of a second conductivity type to separate the opto-electrical conversion well of the first conductivity type so as to form a plurality of photodiodes, a cap layer of the second conductivity type formed on a surface of the opto-electrical conversion well, a charge drain control layer of the second conductivity type formed within the opto-electrical conversion well of the first conductivity type, a photodiode well and a charge drain well of the photodiode formed by providing the charge drain control layer, formed within the opto-electrical conversion well of the first conductivity type.

In a second aspect of the present invention, the cap layer, the separation layer, and the charge drain control layer have depths that increase in this sequence.

In a third aspect of the present invention, the cap layer, the separation layer, and the charge drain control layer have impurity concentrations that increase in this sequence.

In a fourth aspect of the present invention, a width W1 of the separation layer is greater than a width W2 of the charge drain control layer.

In a fifth aspect of the present invention, a width of the charge drain control layer is formed to be greater than 1 μm so as to obtain an overflow drain operation mode device.

In a sixth aspect of the present invention, a width of the charge drain control layer is formed to be at least 1 μm so as to obtain an shutter operation mode device.

A method of the present invention is a method of solid-state imaging device comprising an opto-electrical conversion well of a first conductivity type formed on a substrate, a separation layer of a second conductivity type to separate the opto-electrical conversion well of the first conductivity type so as to form a plurality of photodiodes, a cap layer of the second conductivity type formed on a surface of the opto-electrical conversion well, a charge drain control layer of the second conductivity type formed within the opto-electrical conversion well of the first conductivity type, a photodiode well and a charge drain well of the photodiode formed by providing the charge drain control layer, formed within the opto-electrical conversion well of the first conductivity type, wherein the method comprising the steps of; a first step of forming the separation layer by ion implantation, a second step of forming the cap layer by ion implantation, and a third step of forming the charge drain control layer by ion implantation over the separation layer.

DETAILED DESCRIPTION OF THE PREFERRED EMBODIMENTS

Preferred embodiments of the present invention are described in detail below, with references being made to relevant accompanying drawings.

In the case in which light incident to a photodiode causes the generation of electrons that cannot be accumulated in the photodiode, the overflow drain has the effect of preventing the excessive electrons from overflowing into the charge transfer elements or into adjacent pixels, causing phenomena such as flare and blooming.

The present invention provides a horizontal-type overflow drain structure and fabricating method so as to minimizes the above-described variations in the fabricating process.

Figure 1:
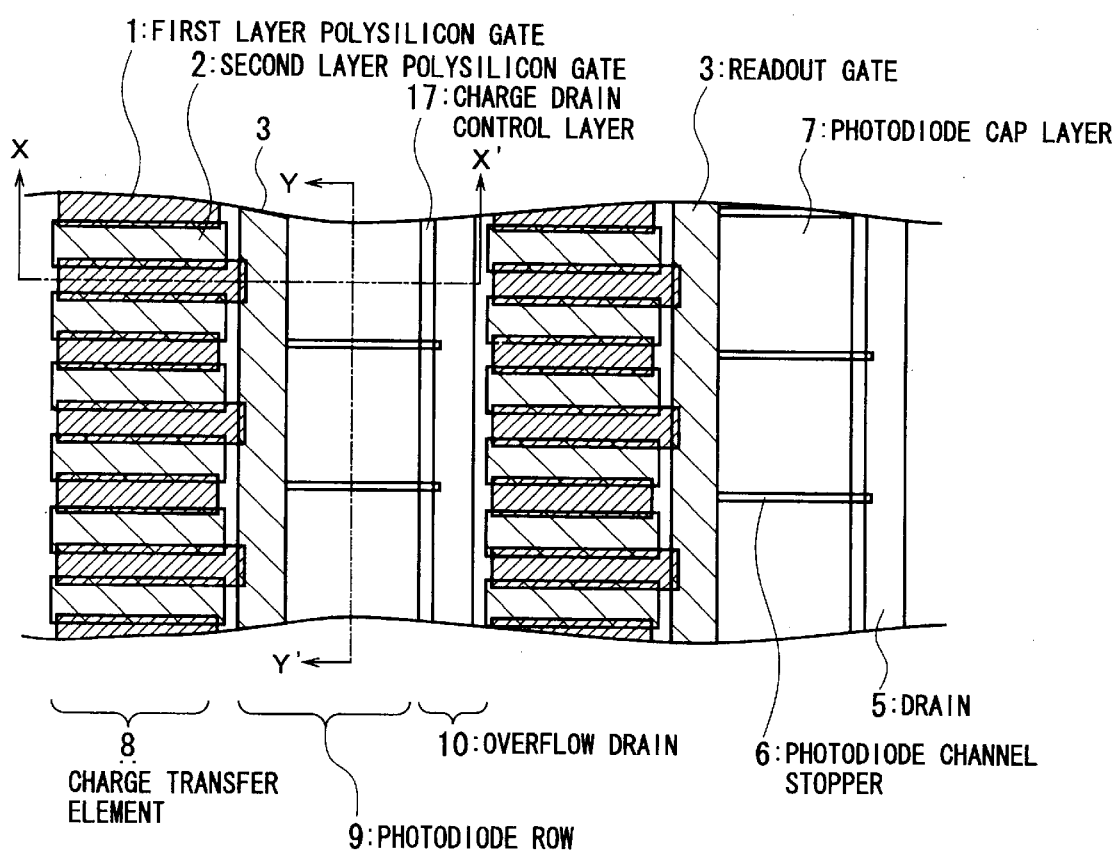
FIG. 1 is a plan view of a solid-state imaging device according to the first embodiment of the present invention.

Specifically, as shown in FIG. 1, adjacent to a photodiode cap layer 7 in the photodiode part, a charge drain control layer 17 for OFD is provided, and a drain 5 is further provided on the opposite side from the charge transfer element 8.

In FIG. 1, the reference numerals 1 and 2 denote first and second polysilicon electrodes that form the charge transfer element 8, the reference numeral 3 is a readout gate fabricated from the second polysilicon layer used when reading out the charge to the charge transfer element 8, and the reference numeral 6 is a photodiode channel stopper used to separate the photodiode.

Figure 2A:
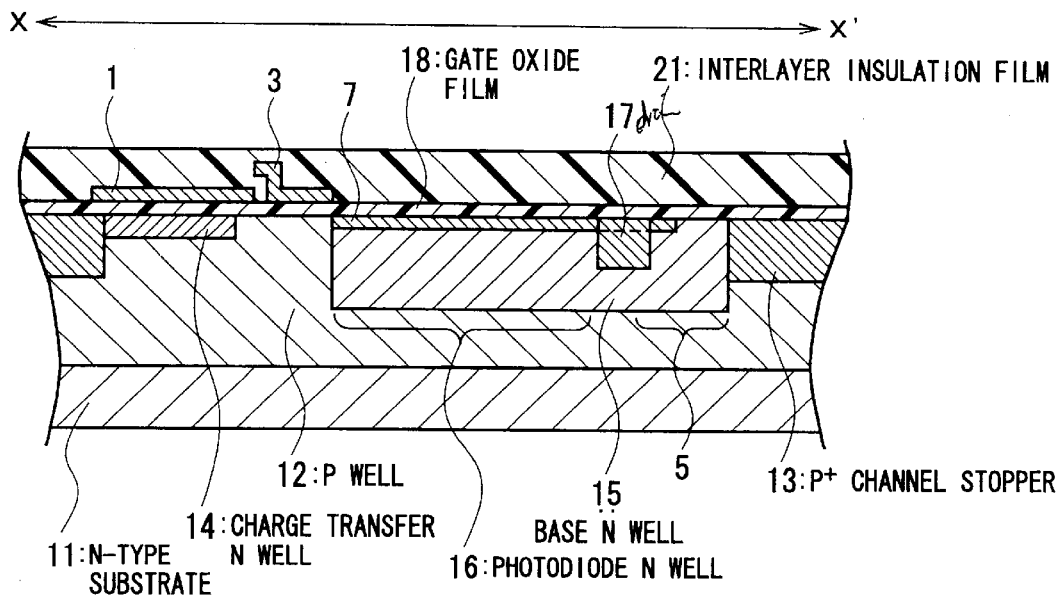
FIG. 2(a) is a cross-sectional view along the cutting line X–X' in the plan view of FIG. 1.
Figure 2B:
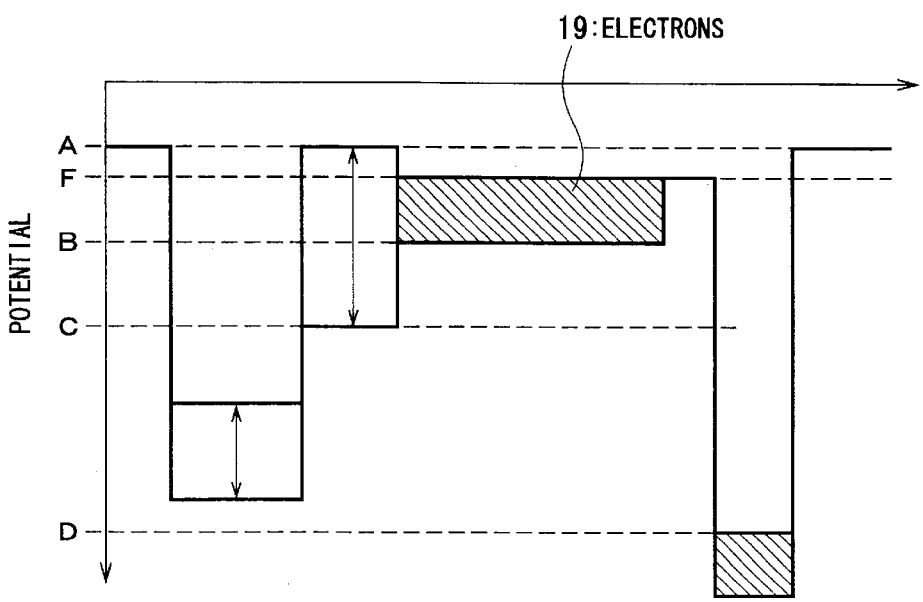
FIG. 2(b) is a potential distribution diagram thereof.

FIG. 2(a) is a cross-sectional view of the structure of FIG. 1, viewed along the cutting line X–X' shown in FIG. 1, and FIG. 2(b) is a drawing showing the potential distribution in various parts thereof. In FIG. 2, the reference numeral 11 denotes an N-type substrate, 12 is a P well, 13 is a P⁺ channel stopper, 14 is a charge transfer N well forming the charge transfer element 8, 1 is the first layer polysilicon gate of the charge transfer element 8, 3 is a readout gate that controls the readout of charge from the photodiode, 16 is a photodiode N well that forms the photodiode, 7 is a photodiode cap layer formed on the photodiode surface, 5 is a drain for the purpose of draining off the electrical charge overflowing from the photodiode, 17 is a charge drain control layer for OFD, 18 is a gate oxide film, and 21 is an interlayer insulation film. Although it is not shown in the drawing, the drain 5 is connected to a power supply.

In the present invention, by providing a charge drain control layer 17 within N well 15, the photodiode N well 16 and drain 5 are formed, the charge drain control layer 17 and the drain 5 forming a horizontal OFD structure.

This embodiment of the present invention will be described further below, with references to the drawings. FIG. 1 is a plan view of the structure of the first embodiment of the present invention.

A readout gate 3 and charge transfer element 8 are provided adjacent to the photodiode row 9, and an OFD charge drain control layer 17 and drain 5 that drain off the overflowed electrical charge in the present invention are disposed in opposition to the readout gate 3.

As shown in FIG. 2, the present invention has a P well 12, a P⁺ channel stopper 13 within the P well 12, a charge transfer N well 14, a N well 15 containing a photodiode N well 16 and a drain 5, a photodiode cap layer 7, a charge drain control layer 17 controlling the potential of the OFD, a gate oxide film 18 formed on the surface of the N-type substrate 11, a first polysilicon gate 1, a readout gate 3 that controls the charge readout from the photodiode, and an interlayer insulation film 21 on the N-type substrate 11. The photodiode cap layer 7 and the charge drain control layer 17 controlling the OFD potential are formed within one N well 15. The photodiode cap layer 7 and the charge drain control layer 17 are formed by superposed implantation.

The potential relationships during operation are described below, with reference made to the potential distribution diagram of FIG. 2(b).

If in the case in which there are no electrons constituting a signal charge, the photodiode potential is B, when a voltage of 0 V is applied to the readout gate 3 (gate voltage for normal charge accumulation), the potential A is 0 V, and when a voltage of 5 V is applied to the readout gate 3 (voltage applied for readout of the electrical charge) the potential is C, in order to achieve normal operation in the OFD part, the potential F must satisfy the following relationship.

$$C > B > F > A \tag{1}$$

Because it is necessary to maximum the capacity of the photodiode part to accumulate an electrical charge, the following relationship is desirable.

$$F=A \quad (2)$$

Figure 3A:
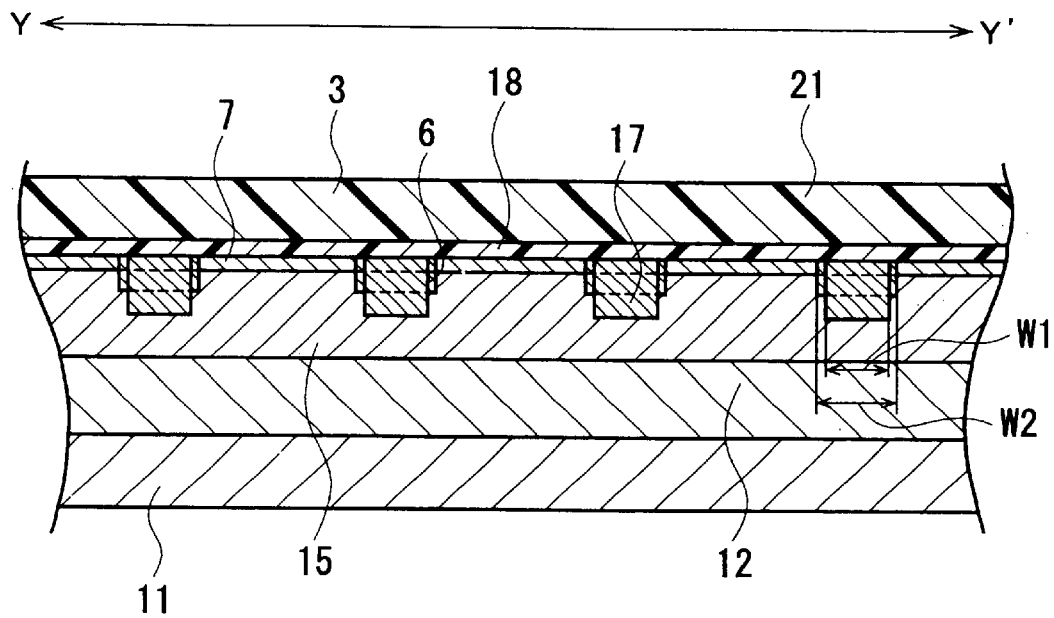
FIG. 3(a) is a cross-sectional view along the cutting line Y–Y' in the plan view of FIG. 1.
Figure 3B:
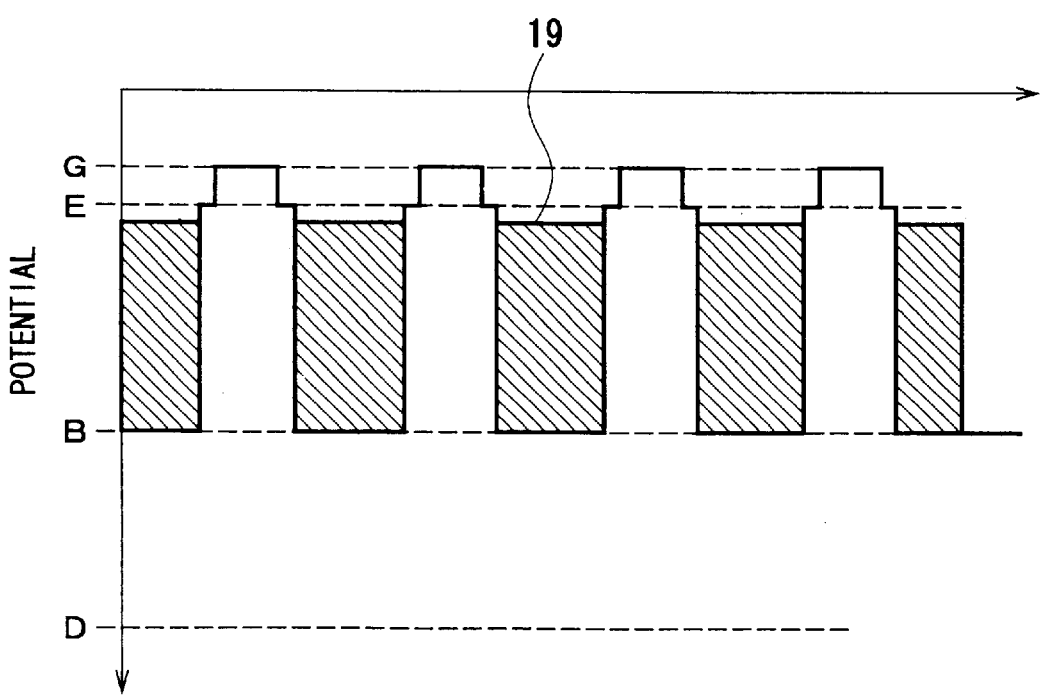
FIG. 3(b) is a potential distribution diagram thereof.

Additionally FIG. 3(a) shows a cross-sectional view along the cutting line Y–Y' in the plan view of FIG. 1, and FIG. 3(b) shows a potential distribution diagram thereof.

In FIG. 3(a), the photodiode separation between photodiodes is formed by P-type ion implantation when forming the charge drain control layer 17 and when the photodiode channel stopper 6 is formed. B denotes the photodiode potential, E is a photodiode channel stopper potential, G is the potential on the part in which P-type ion implantation is performed to form the photodiode channel stopper 6 and the charge drain control layer 17.

In this case, the potential relationship required so that a signal electrical charge does not overflow into an adjacent pixel is as follows.

$$F \geq G \quad (3)$$

The following relationship is required to satisfy all of the relationships (1) to (3).

$$C > B > F \geq A \geq G \quad (4)$$

Figure 5A:
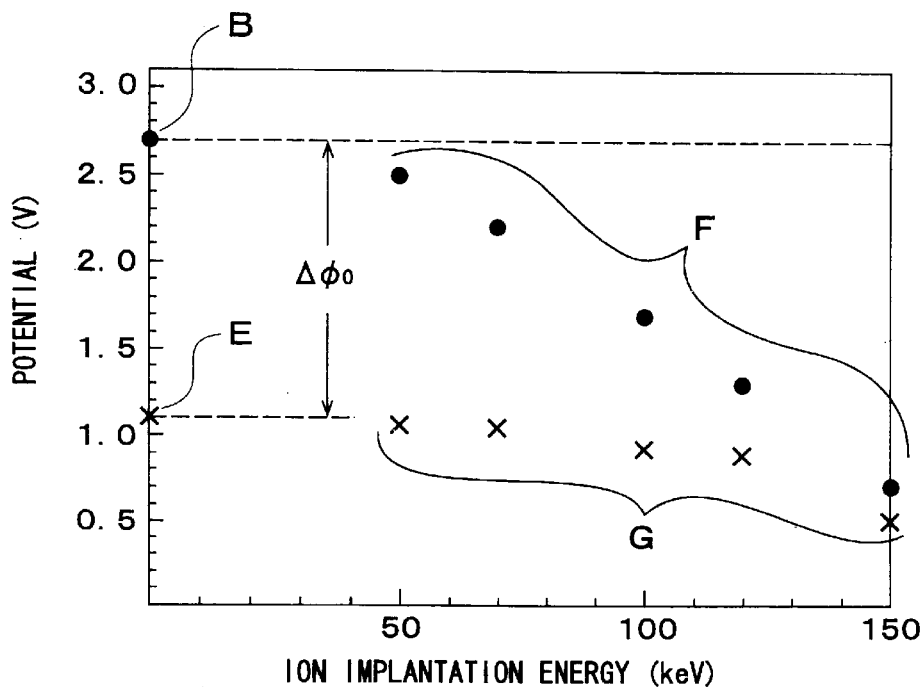
FIG. 5(a) is a graph showing, for various ion implantation conditions, the potential measured values in the first embodiment.

FIG. 5 (a) is a drawing showing the results of measuring the actual potential at various parts, indicating C=4 V, B=2.7 V, E=1 V, G=0.6 to 1.1 V, F=0.8 to 2.7 V.

From the above-noted data, the boron implantation in the OFD part done with a concentration in the range from 2.0 to $8.0 \times 10^{12}/cm^2$, and ideally a dose amount at $5.0 \times 10^{12}/cm^2$ with an ion implantation energy in the range from 120 to 150 keV.

Figure 4:
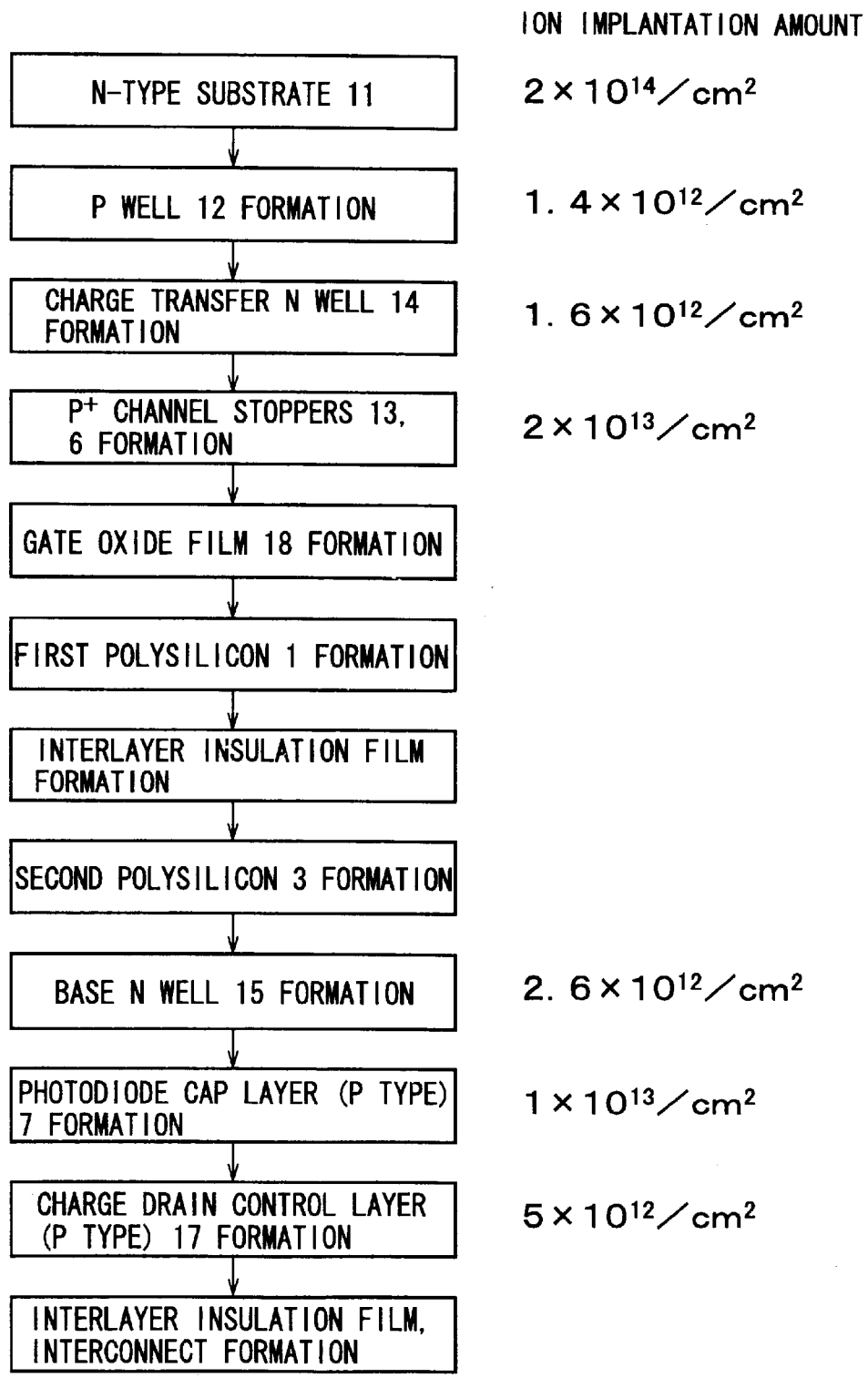
FIG. 4 is a flowchart showing the steps for manufacturing a solid-state imaging device according to the first embodiment of the present invention.

FIG. 4 is a fabricating process showing the steps for fabricating an OFD structure according to the present invention. The values to the right of the manufacturing process indicate exemplary ion implantation dose amounts. The manufacturing process flow is described below.

A P well 12 is formed on the N-type substrate 11. Additionally, a charge transfer N well 14 is selectively formed in a P well 12. For the purpose of separating the charge transfer element 14 and the photodiode, a P+ channel stopper (photodiode channel stopper 6 and P+ channel stopper 13) is selectively formed, and a gate oxide film 18 is grown on the surface of the N-type substrate 11.

After forming the polysilicon used for the charge transfer element and the transistors, a N well 15 for the photodiode is formed in a self-alignment manner with respect to the readout gate 3 of the second layer polysilicon. The surface of the photodiode is subjected to P-type ion implantation so as to form the photodiode cap layer 7, thereby preventing pixel damage.

After completion of the forming of the photodiode part, the N well 15 is subjected to P-type ion implantation, thereby forming the charge drain control layer 17 and simultaneously forming the photodiode N well 16 and the OFD drain 5 in the N well 15. The interlayer insulation film 21 and the interconnections are then formed, thereby completing the fabrication of the solid-state imaging device.

According to the above-described manufacturing method, it is possible to achieve an OFD structure that has a small amount of variation in the accumulated charge amount.

To further clarify the features of the OFD according to the present invention, the problems occurring in an OFD in the past are described below.

The potential variation of the photodiode N well making up the photodiode is large (specifically, approximately 0.5 V), and there is variation even within one and the same device. Because of the surface channel, the shutter gate potential is dependent upon the gate voltage, and exhibits a small amount of variation (specifically, approximately 0.1 V). The accumulated electrical charge corresponds to the difference between the photodiode part potential and the shutter gate potential. For this reason, in a horizontal-type OFD using a gate of the past, variation occurs in the maximum charge that could be accumulated in each photodiode, thereby resulting in observable image variations in the saturated condition.

Figure 5B:
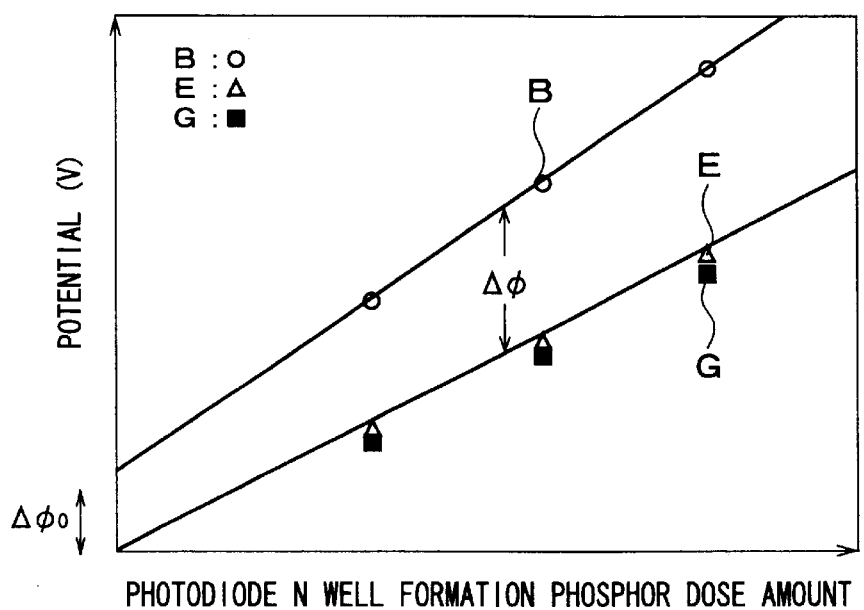
FIG. 5(b) is a graph showing the potential simulated values in the case that the ion implantation dose amount is changed, when the photodiode N well is formed, in the first embodiment.

FIG. 5(b) shows a schematic representation of the result of a simulation with regard to the amount of accumulated charge with respect to the depletion voltage variation (corresponding to B) of the photodiode. The horizontal axis represents the dose amount of phosphor ions when the photodiode N well 16 is formed, and the vertical axis shows the dependency of the potentials G, E, and B shown in FIG. 3(b) on the amount of the phosphor ion dose. With respect to a change in the depletion voltage B of the photodiode, there is a small potential difference variation Δφ, which serves as a guide to the variation in the amount of accumulated charge in the photodiode. Additionally, compared to a conventional photodiode, the amount of accumulated charge is greater than in the past.

Therefore, with the horizontal-type OFD of the present invention, if the ion implantation region of the photodiode N well 16 forming the photodiode and the boron implantation region of the OFD charge drain control layer 17 are formed so as to be superposed, even in the case in which there is variation in the potential B of the photodiode N well 16, because the F indicated in the potential diagram of FIG. 2 varies in the same direction as the potential B, not only is the variation in the maximum amount of electrical charge that can be accumulated smaller than in the past, but there is also an increase in the amount of charge that can be accumulated.

When using the present invention as an OFD, because the potential in the OFD part is determined by the amount of P-type ion implantation in the charge drain control layer 17, there is no need for a power supply connected to the shutter gate as was required in the past.

Figure 11:
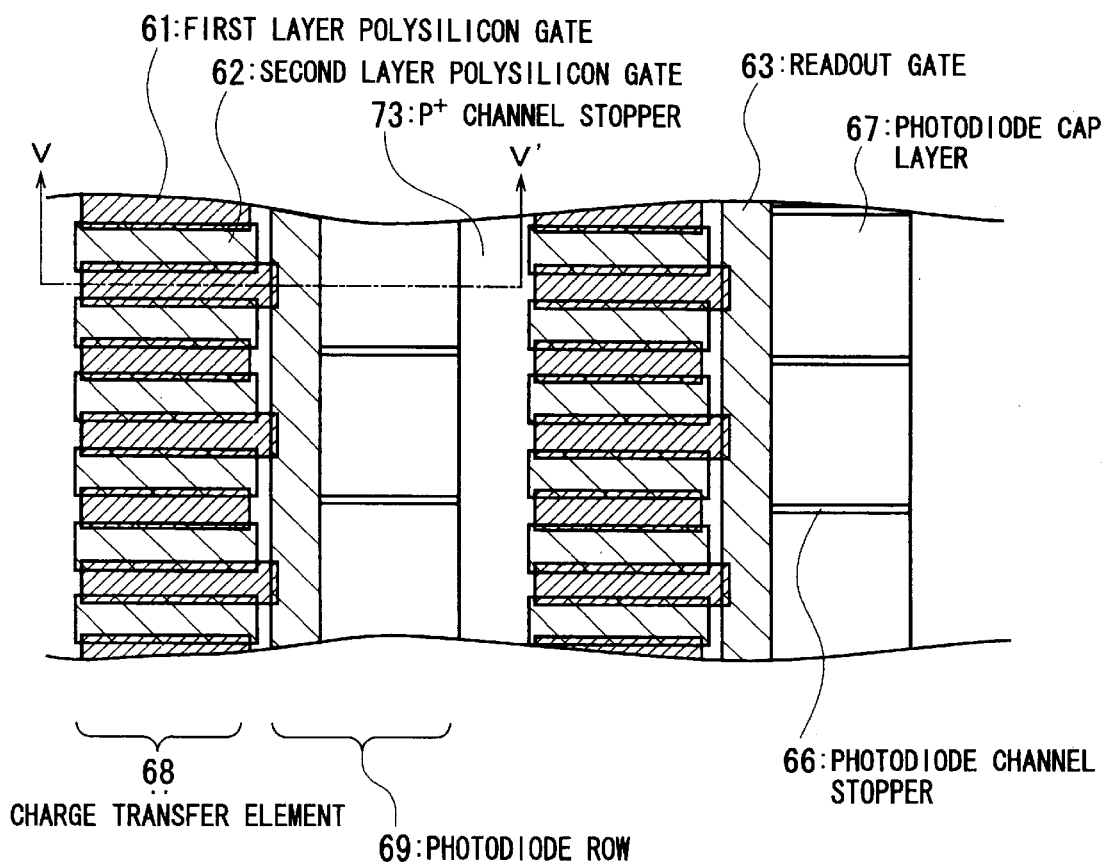
FIG. 11 is a plan view of a solid-state imaging device according to the second example of prior art.
Figure 12A:
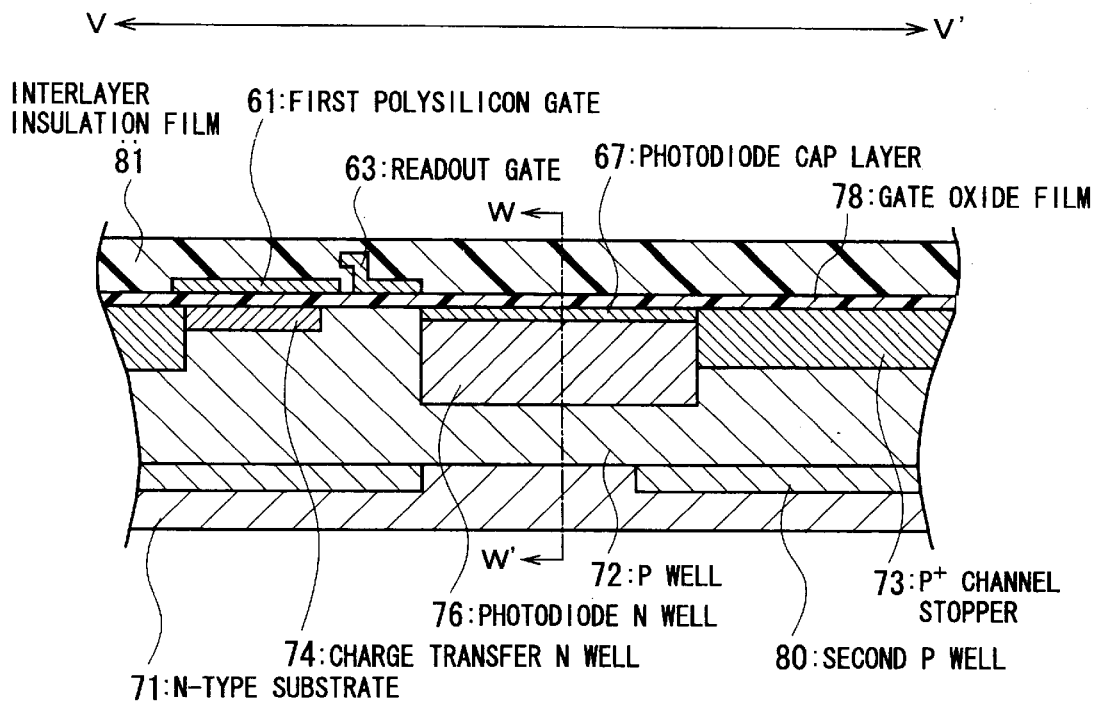
FIG. 12(a) is a cross-sectional view along the cutting line V–V' in the plan view of FIG. 11.
Figure 12B:
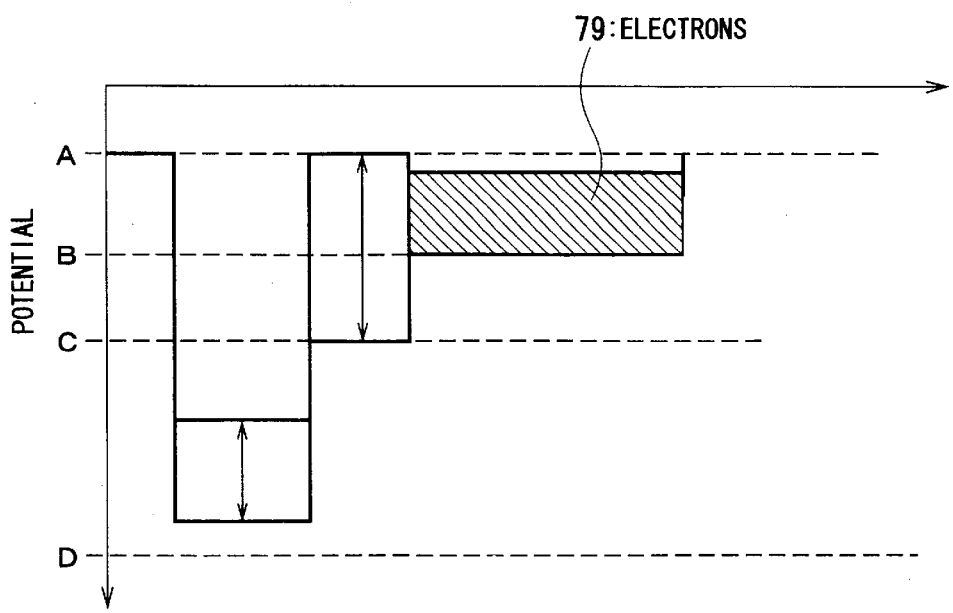
FIG. 12(b) is a potential distribution diagram thereof.
Figure 13:
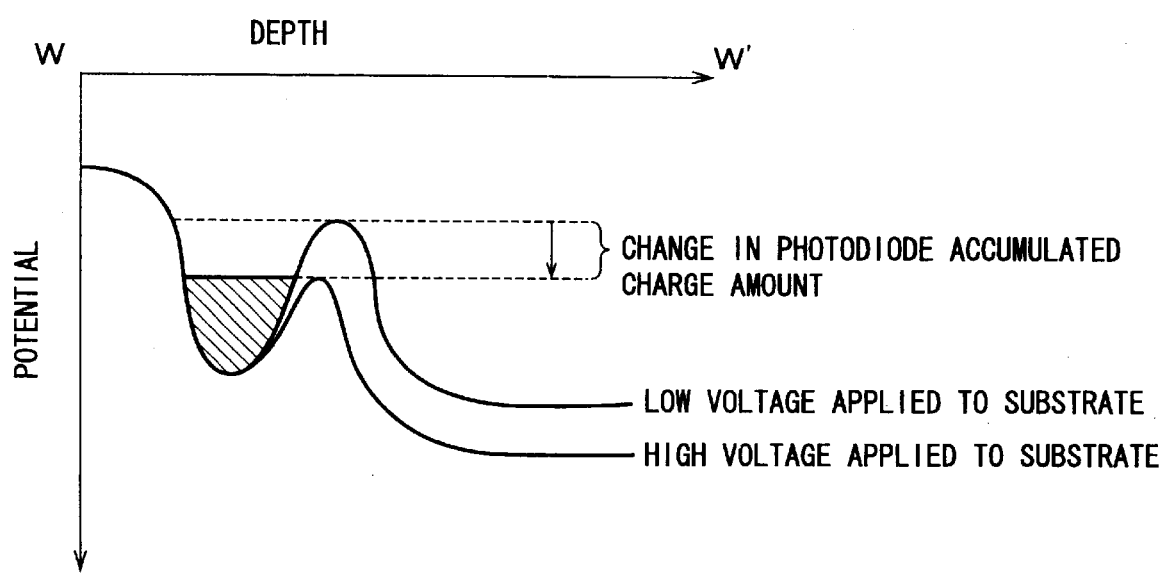
FIG. 13 is a potential distribution diagram along the cutting line W–W' shown in FIG. 12(a).

In the present invention, there is no need to provide a high-voltage power supply (approximately 18 V) for draining off electrons as was required with a vertical-type OFD structure of prior art as shown in FIG. 11 to FIG. 13. It is sufficient that the voltage connected to the drain 5 of the present invention be higher than the channel potential B of the photodiode part, and specifically this voltage be approximately 5 V. Although in a vertical-type OFD structure, it is necessary to have a second P well so as not to pull an electrical charge from parts other than the photodiode part in the direction of the N-type substrate, with the present invention this second P well is not necessary to pull away excessive electrical charge in the horizontal direction.

A second embodiment of the present invention has basically the same structure as the first embodiment, and is shown as an application of the first embodiment, for the case of a shutter structure.

In the second embodiment, this is achieved by controlling a voltage applied to the drain 5 and controlling the width of the charge drain control layer 17.

More specifically, for the case of use as an overflow drain structure, it is sufficient that the voltage applied to the drain 5 be higher than B (approximately 3 V).

In order to operate the present invention as a shutter, it is necessary to apply a pulse to the drain.

Figure 7:
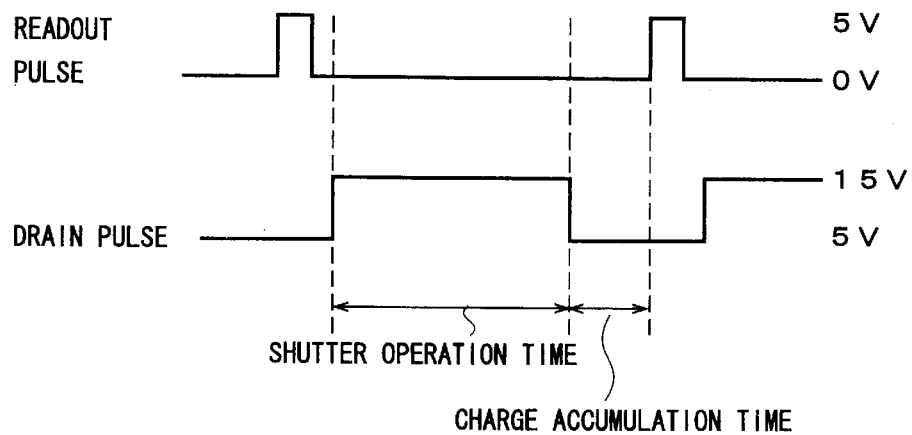
FIG. 7 is a drawing showing a pulse waveform applied to the drain of a solid-state imaging device according to the second embodiment of the present invention.
Figure 8:
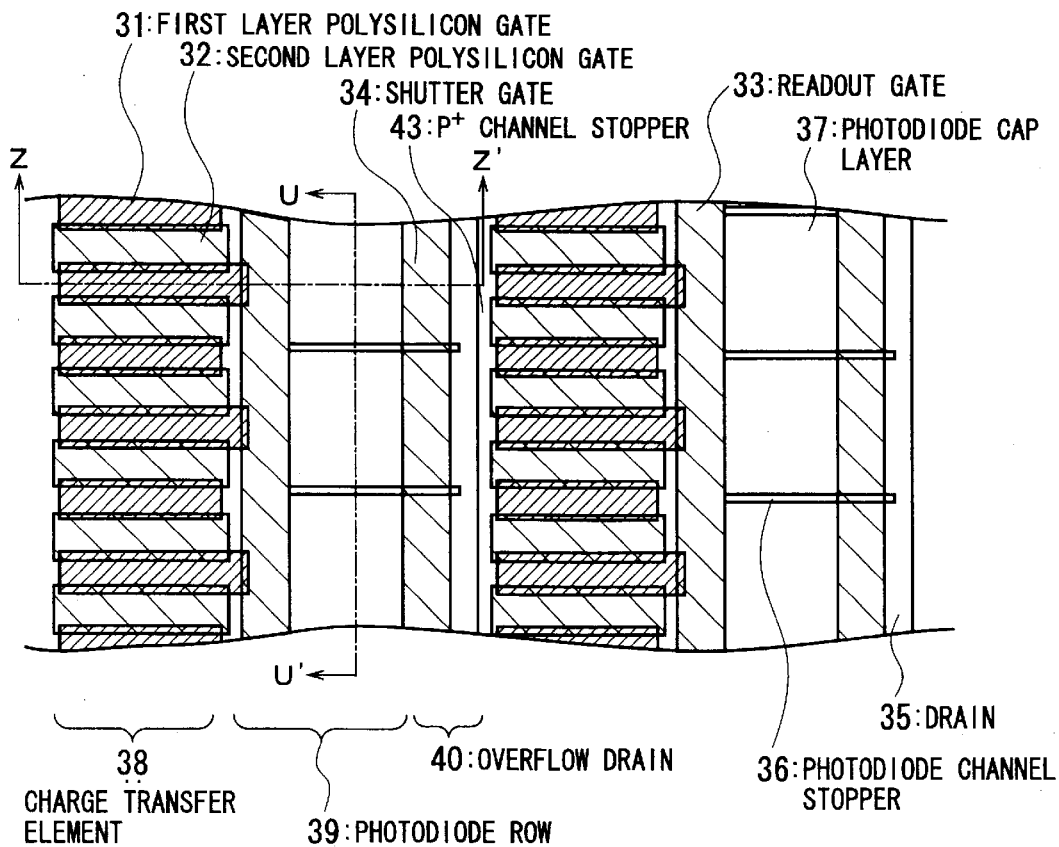
FIG. 8 is a plan view of a solid-state imaging device according to the first example of prior art.
Figure 9A:
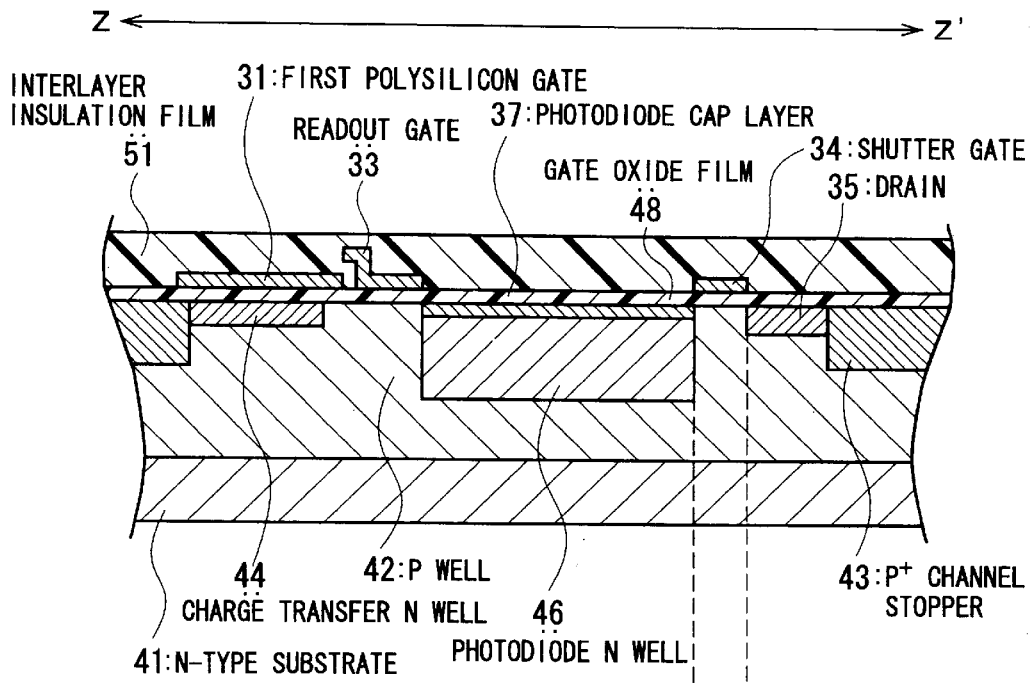
FIG. 9(a) is a cross-sectional view along the cutting line Z–Z' in the plan view of FIG. 8.
Figure 9B:
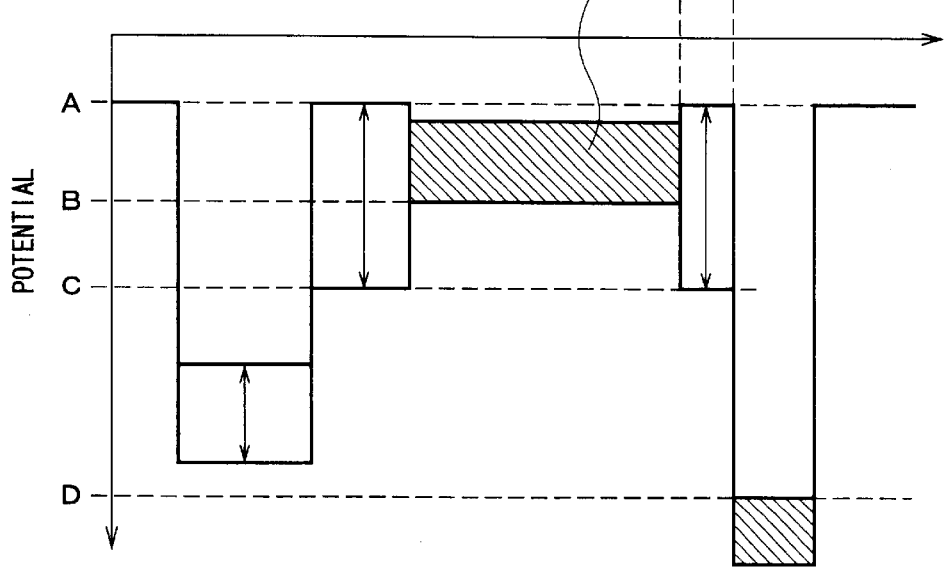
FIG. 9(b) is a potential distribution diagram thereof.
Figure 10A:
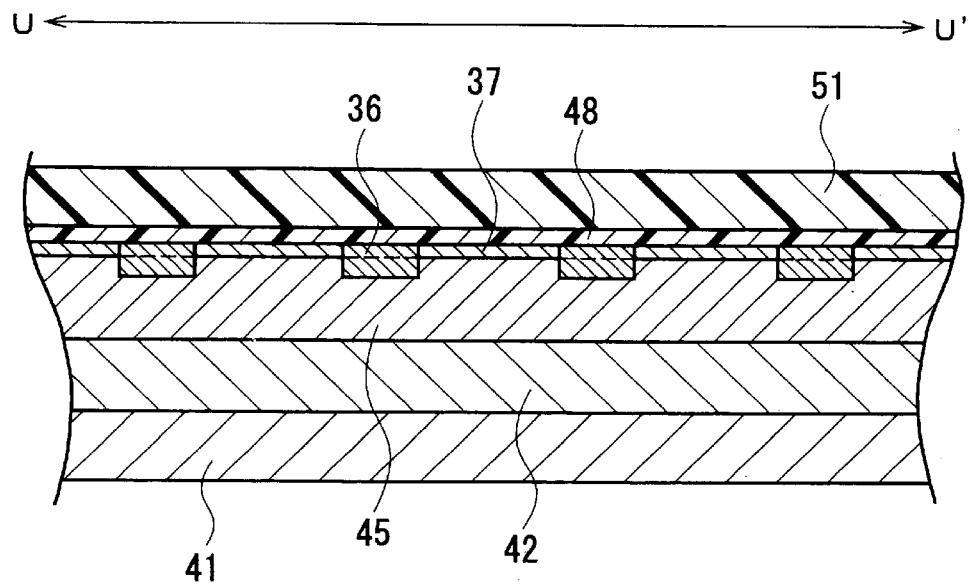
FIG. 10(a) is a cross-sectional view along the cutting line U–U' in the plan view of FIG. 8.
Figure 10B:
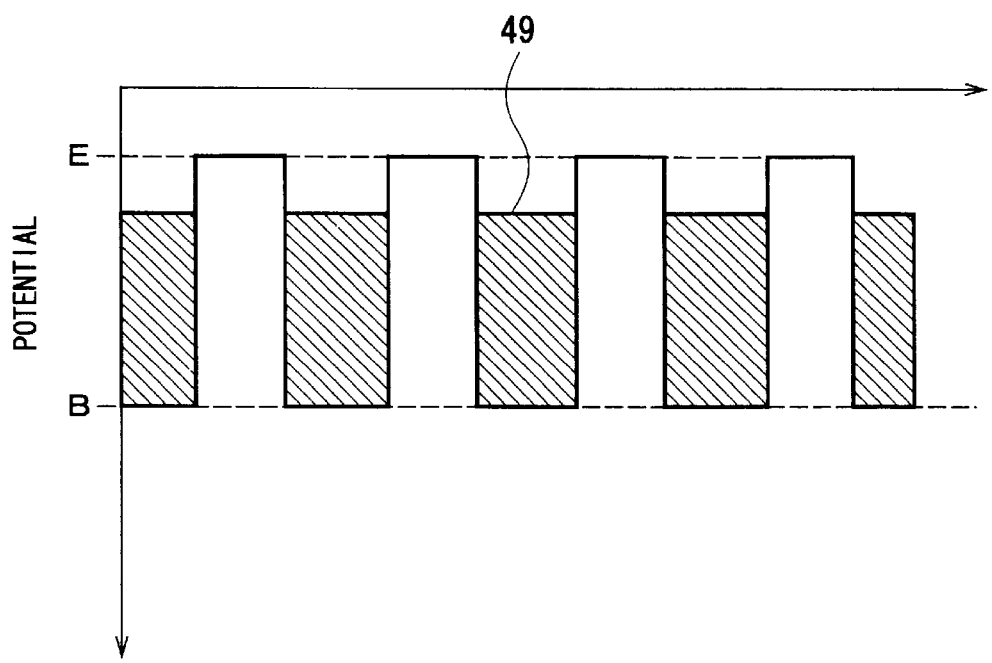
FIG. 10(b) is a potential distribution diagram thereof.

The voltage of the applied pulse, as shown in FIG. 7, causing shutter operation, and if all of the electrical charge of the photodiode is to be drained away, a voltage of greater than approximately 15 V is applied. In the case of accumulating a charge on the photodiode, a voltage of approximately 3 to 5 V is applied, the same as in the case of overflow drain operation.

In the case of the manufacturing process steps shown in FIG. 4, the width of the charge drain control layer 17 should be made greater than approximately 1 μm for overflow drain operation and less than approximately 1 μm for shutter operation. This value will differ depending the actually finished depth, the P-type semiconductor material properties of the charge drain control layer 17, the implantation energy, and the implantation dose.

Figure 6A:
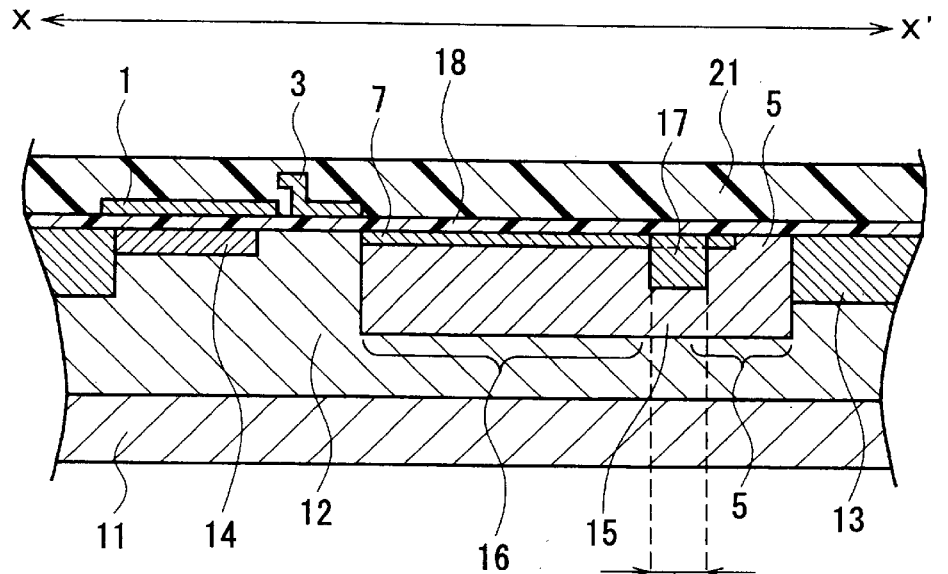
FIG. 6(a) is a cross-sectional view of a solid-state imaging device according to the second embodiment of the present invention and FIG. 6(b) is a potential distribution diagram thereof.

FIG. 6 shows a cross-sectional view along the cutting line X–X' shown in FIG. 1, and the associated potential distribution.

Figure 6B:
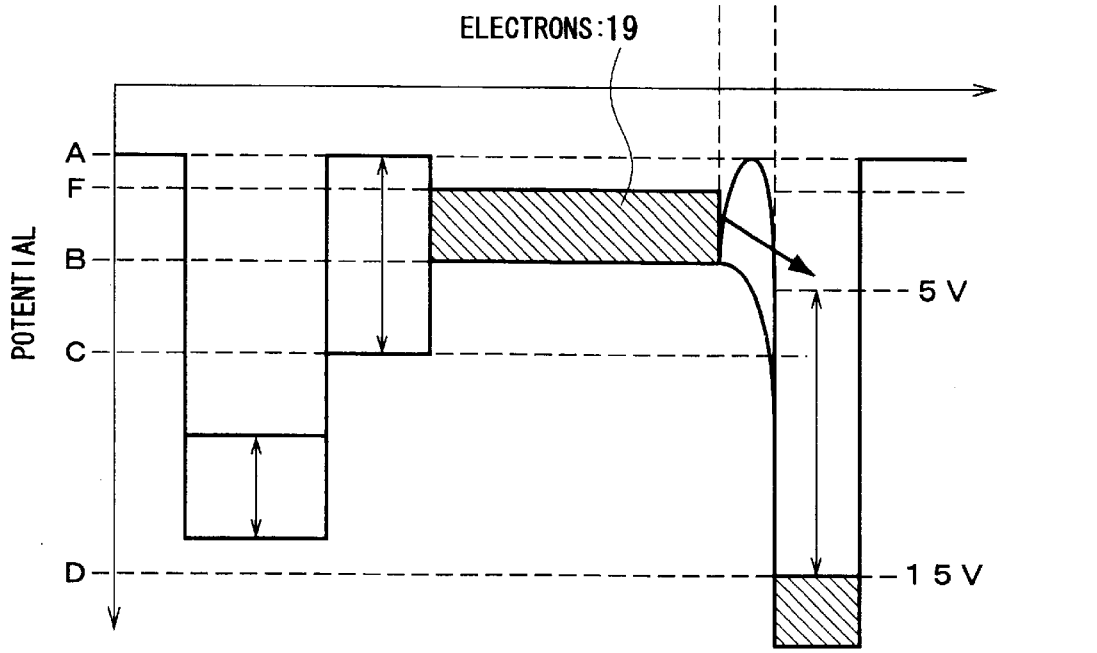

When performing shutter operation and draining away an electrical charge from the photodiode, the voltage applied to the drain causes a short channel effect, the potential on the charge drain control layer 17 exhibiting a curvature, so that the electrons 19 representing the signal charge are drained away from the photodiode N well 16 to the drain 5 as shown in FIG. 6(b).

Regarding the step of the formation of the charge drain control layer 17, it is possible to move this step to any part of the manufacturing step, as long as it is after the formation of the P$^+$ channel stoppers 13 and 6.

It will also be readily understood that in the foregoing descriptions, the expressions N-type and P-type can be reversed.

According to the present invention, by implanting P-type ions into one N well 15, so as to form a charge drain control layer 17 and make the photodiode N well 16 and OFD drain 5, even if there is variation in the potential of the photodiode N well 16 forming the photodiode, because the potential of the charge drain control layer 17 varies in the same direction as the potential of the photodiode N well 16, there is no occurrence of variation in the maximum amount of charge that can be accumulated and, as a result, the effect achieved is that there is no variation in the signal in the saturated condition.

What is claimed is:

1. A solid-state imaging device comprising;

an opto-electrical conversion well of a first conductivity type formed on a substrate, a separation layer of a second conductivity type to separate said opto-electrical conversion well of said first conductivity type so as to form a plurality of photodiodes, a cap layer of said second conductivity type formed on a surface of said opto-electrical conversion well, a charge drain control layer of said second conductivity type formed within said opto-electrical conversion well of said first conductivity type, a photodiode well and a charge drain well of said photodiode formed by providing said charge drain control layer, formed within said opto-electrical conversion well of said first conductivity type.

2. A solid-state imaging device according to claim 1, wherein said cap layer, said separation layer, and said charge drain control layer having respective depths that increase in this sequence.

3. A solid-state imaging device according to claim 1, wherein said cap layer, said separation layer, and said charge drain control layer having respective impurity concentrations that increase in this sequence.

4. A solid-state imaging device according to claim 1, wherein a width of said separation layer is greater than a width of said charge drain control layer.

5. A solid-state imaging device according to claim 1, wherein a width of said charge drain control layer is formed to be greater than 1 μm so as to obtain an overflow drain operation mode device.

6. A solid-state imaging device according to claim 1, wherein a width of said charge drain control layer is formed to be at least 1 μm so as to obtain an shutter operation mode device.

* * * * *